United States Patent [19]

Chen et al.

[11] Patent Number: 5,457,069
[45] Date of Patent: Oct. 10, 1995

[54] PROCESS FOR FABRICATING DEVICE HAVING TITANIUM-TUNGSTEN BARRIER LAYER AND SILICIDE LAYER CONTACTED SHALLOW JUNCTION SIMULTANEOUSLY FORMED

[75] Inventors: Mao-Chieh Chen, Hsinchu; Fann-Mei Yang, Shanhua Town, both of Taiwan

[73] Assignee: National Science Council, Taipei, Taiwan

[21] Appl. No.: 298,187

[22] Filed: Aug. 31, 1994

[51] Int. Cl.$^6$ .......................... H01L 21/44; H01L 21/443
[52] U.S. Cl. .......................... 437/190; 437/200; 437/201
[58] Field of Search .................................. 437/192, 196, 437/200, 201, 190

[56] References Cited

U.S. PATENT DOCUMENTS

| 4,478,881 | 10/1984 | Bartus et al. | 437/201 |
| 4,870,033 | 9/1989 | Hotta et al. | 437/192 |
| 5,084,417 | 1/1992 | Joshi et al. | 437/192 |
| 5,208,170 | 4/1993 | Kobeda et al. | 437/34 |
| 5,302,552 | 4/1994 | Duchateau et al. | 437/200 |

OTHER PUBLICATIONS

T. G. Finstad, et al. "Interaction of Evaporated Pd and Ti Films With Single Crystal Silicon" Thin Solid Films 68 (1980) pp. 393–405.
"Ti–Walloy interaction with silicon in the presence of PtSi" J. Appl. Phys. 54(5) May 1983 pp. 2434–2440 F. Nava, et al.
Fann–Mei Yang et al., *Formation of self–aligned cobalt silicide in normal flow nitrogen furnace*, Thin Solid Films, vol. 207, pp. 75–81, Taiwan, 1992.
M. Lawrence A. Dass et al., *Growth of epitaxial CoSi$_2$ on (100)Si*, Appl. Phys. Lett., vol. 58, No. 12, pp. 1308–1310, Mar. 1991.
Fann–Mei Yang et al., *Formation of cobalt silicide under a passivating film of molybdenum or tungsten*, J. Vac. Sci. Tech., vol. B9, No. 3, pp. 1497–1502, May/Jun. 1991.
Marvin Tabasky et al., *Direct Silicidation of Co on Si by Rapid Thermal Annealing*, IEEE Transactions of Electron Devices, vol. ED–34, No. 3, pp. 548–553, Mar. 1987.
A. E. Morgan et al., *Characterization of a Self–Aligned Cobalt Silicide Process*, J. Electro. Chem. Soc., vol. 134, No. 4, pp. 925–935, Apr. 1987.
L. Van den hove et al., *A self–aligned cobalt silicide technology using rapid thermal processing*, J. Vac. Sci. Tech. vol. B4, No. 6, pp. 1358–1363, Nov./Dec. 1986.
S. P. Murarka, *Silicides for VLSI Applications*, Academic Press, New York, pp. 130, 169, 1983.
M. Eizenberg et al., *Formation of shallow silicide contacts of high Schottky barrier on Si: Alloying Pd and Pt with W vs alloying Pd and Pt with Si*, J. Appl. Phys., vol. 53, No. 3, pp. 1577–1585, Mar. 1982.
G. Ottaviani et al., *Phase separation in alloy–Si interaction*, Appl. Phys. Lett., vol. 36, No. 4, pp. 331–333, 15 Feb. 1980.

*Primary Examiner*—Olik Chaudhuri
*Assistant Examiner*—C. Everhart
*Attorney, Agent, or Firm*—Madson & Metcalf

[57] ABSTRACT

A process for fabricating a device having a TiW barrier layer and a relatively shallow junction contacted with a silicide layer wherein said TiW barrier layer and said silicide layer are simultaneously formed comprising steps of preparing a Si substrate, applying a layer including therein a Ti and an appropriate X element such as Co or Pt on the Si substrate, applying a W layer on the layer including therein the Ti and the X element for forming a W/X-Ti/Si structure, and transforming the W/X-Ti/Si structure into a TiW/silicide/Si structure to obtain the device having a TiW barrier layer and a silicide layer contacted shallow junction. The present invention provides a simplified process for fabricating such a device having therewith a junction of a low resistance and a high temperature stability.

16 Claims, 5 Drawing Sheets

Sputtering time(min.)

PROCESS FOR FABRICATING DEVICE HAVING TITANIUM-TUNGSTEN BARRIER LAYER AND SILICIDE LAYER CONTACTED SHALLOW JUNCTION SIMULTANEOUSLY FORMED

FIELD OF THE INVENTION

This invention relates generally to a process for fabricating a device having a barrier layer and a silicide layer contacted shallow junction, and more particularly to a process for fabricating a device having a titanium-tungsten barrier layer and a silicide layer contacted shallow junction simultaneously formed.

BACKGROUND OF THE INVENTION

The techniques for fabricating integrated circuits have been developed into the sub-micron level. Therefore, due to the trend of progressively minimizing the dimensions of the integrated circuits in the art, the silicides having therewith a relatively low resistivity are widely utilized in local interconnection, gate, and source and drain contact areas for reducing the series resistance and contact resistance. $TiSi_2$, $CoSi_2$, and PtSi are the most emphasized silicides attracting artisans in the art nowadays. They have their individual advantages, and shortages as well, on the applications to the integrated circuits. Both of the $CoSi_2$ and PtSi have advantages of low resistivity, low silicidation temperature, chemical stability, inactivity to doped atom such as As or B, and characteristics of self-alignment on processing. $CoSi_2$ is capable of forming an epitaxy on a (100) crystalline silicon, as disclosed in Ref. 1. Nevertheless, some shortages of these silicides still exist.

First of all, Al is a hot and outstanding material as a conducting medium to be deposited on the silicide, e.g. $CoSi_2$ or PtSi, for a connection to an outer conducting wire. However, the reaction temperature of either $CoSi_2$ or PtSi with Al is relatively low. The temperature required for reacting $CoSi_2$ with Al is about 400° C. and that for PtSi is only about 250° C. The low reaction temperature will result in adverse influences to the subsequent heating process after the step of Al deposition since the silicide will react with Al if the temperature of the post-Al process used in the heat treatment is higher than the temperature at which the reaction would occur. For eliminating the adverse influences, a feasible way is to deposit a barrier layer, e.g. TiW layer, after the formation of the silicide, and then deposit the Al layer on the barrier layer. The TiW barrier layer can thereby inhibit the reaction between the silicide and Al.

Secondly, as cobalt deposited on Si is liable to be oxidized during a silicidation annealing, the silicidation process of cobalt must be executed in a high temperature vacuum furnace or by a rapid thermal annealing (RTA), as disclosed in Refs. 2–5. However, this requires equipments of high costs and is not compatible with the processing equipments presently employed in the production line. Another alternative is to coat an inert protective layer on the Co layer before the silicidation process, as disclosed in Ref. 6. However, it takes much more steps and complicates the entire processing.

Thirdly, the large consumption of Si during the silicidation of cobalt is harmful to a shallow silicided junction. For the silicidation of cobalt to form $CoSi_2$, Si consumption per unit Å of cobalt is about 3.64Å, as disclosed in Ref. 7. If the thickness of the Co layer is too large, then the shallow junction will be totally destroyed. Conventionally, a thin Co layer is deposited on the Si layer to prevent excessive consumption of Si and reduce the thickness of the silicide as well so as to preserve the shallow junction. Nevertheless, if a thin metal film is deposited on the Si layer, pin holes will easily occur thereon, which is notoriously adverse to the properties of the product.

For solving the aforementioned problems for the applications of silicides, a two-metal alloy scheme was disclosed, as disclosed in Ref. 8. This method utilizes two metals having different silicidation temperatures, which are usually one noble metal such as Pt or Pd and one refractory metal such as W, to be simultaneously deposited on the Si substrate. Due to the difference of the silicidation temperatures of the two metals, when an appropriate temperature lying between the silicidation temperatures of the two metals is applied to the annealing process, the noble metal having a lower silicidation temperature will be silicidized to form a silicide layer directly in contact with the Si substrate while the refractory metal having a higher silicidation temperature will not be silicidized and is isolated from the Si substrate by the silicide layer. The resulting structure would be W/PtSi/Si or W/PdSi/Si. Therefore, the W layer isolated from the Si substrate can act as a diffusion barrier layer between the silicide and the Al layers.

Although the two-metal alloy scheme would possibly solve the above-mentioned problems faced by the applications of the silicide, the effect and the performance are not as good as what are expected. First, the diffusion barrier property of the W layer, which acts as a diffusion barrier layer, is not ideal. Second, a heat treatment therefore must be executed in a vacuum furnace or in a helium furnace, as disclosed in Refs. 9 and 10, which is inconvenient and not ideal. Recently, there is one process for simultaneously forming a TiN barrier layer and a $CoSi_2$ layer. However, the heat treatment is executed by a rapid thermal annealing process, which is not matchable with the nowaday fabrication equipment such as a nitrogen furnace.

The references cited by the Inventor are summarized as follows and hereinbefore called Refs. 1–10 respectively.

1. M. L. A. Dass, D. B. Fraser, and C. S. Wei, Appl. Phys. Lett., 58, 1308 (1991).

2. A. E. Morgan, E. K. Broadbent, M. Delftno, B. Coulman, and D. K. Sadana, J. Electrochem. Soc., 134, 925 (1987).

3. L. Van den hove, R. Wolters, K. Maex, R. De Keersmaecker, and G. Declerck, J. Vac. Sci. Technol., B4, 1358 (1986).

4. M. Tabasky, E. S. Bulat, B. M. Ditchek, M. A. Sullivan, and S.C. Shatas, IEEE Trans. Electron Device, ED-34, 548 (1987).

5. F. M. Yang and M. C. Chen, Thin Solid Films, 207, 75 (1992).

6. F. M. Yang and M. C. Chen, J. Vac. Sci. Technol., B9, 1497 (1991).

7. S. P. Murarka, Silicides for VLSI Applications (Academic, New York, 1983), p. 130.

8. S. P. Murarka, Silicides for VLSI Applications (Academic, New York, 1983), p. 169.

9. M. Eizenberg and K. N. Tu, J. Appl. Phys., 53, 1577 (1982).

10. G. Ottaviani, K. N. Tu, J. W. Mayer, and B. Y. Tsaur, Appl. Phys. Lett., 36, 331 (1980).

SUMMARY OF THE INVENTION

An object of the present invention is to offer a process for manufacturing a device simultaneously forming thereon a silicide layer contacted shallow junction and a diffusion barrier layer.

Another object of the present invention is to offer a process for simplifying the steps of forming a silicide layer when manufacturing a device having thereon a silicide layer contacted shallow junction and a diffusion barrier layer.

Another object of the present invention is to offer a process capable of preventing a silicide from a lateral growth when manufacturing a device having thereon a silicide layer contacted shallow junction and a diffusion barrier layer.

Another object of the present invention is to offer a process for reducing a resistivity of an acting zone of the device having thereon a silicide layer contacted shallow junction and a diffusion barrier layer.

In accordance with the present invention, a process for fabricating a device having a TiW barrier layer and a silicide layer contacted shallow junction simultaneously formed comprising preparing a Si substrate applying an alloy layer including a Ti and an X element, such as Co or Pt, on the Si substrate, applying a W layer on the alloy layer for forming a W/X-Ti/Si structure, and transforming the W/X-Ti/Si structure into a TiW/silicide/Si structure to obtain the device having the TiW barrier layer and a silicide layer contacted shallow junction.

In accordance with another aspect of the present invention, wherein the two applying steps are respectively executed by a deposition process which can be a sputtering process or a dual electron-beam gun evaporation.

In accordance with another aspect of the present invention, wherein the applied W layer has a thickness and the applied Co-Ti or Pt-Ti layer has a thickness and composition such that after the transforming step is executed, the Co or Pt element will completely react with Si element of the substrate to form the $CoSi_2$ or PtSi layer and the Ti in the Co-Ti or Pt-Ti layer will be completely dissolved in the W layer.

In accordance with another aspect of the present invention, wherein the thickness of the applied W layer is about 400Å and that of the Co-Ti or Pt-Ti layer is about 360Å.

In accordance with another aspect of the present invention, wherein the composition of the Co-Ti or Pt-Ti layer has a Co-Ti or Pt-Ti atomic ratio of about 63:37.

In accordance with another aspect of the present invention, a Ti-W weight ratio of the TiW layer is about 10:90.

In accordance with another aspect of the present invention, the transforming step is a heat-treating process, and is particularly an annealing process.

In accordance with another aspect of the present invention, the transforming step is executed in a furnace with flowing nitrogen and at a relatively high temperature ranging from about 620° C. to about 760° C. for about 30 minutes.

In accordance with another aspect of the present invention, the transforming step is executed once.

In accordance with another aspect of the present invention, wherein the barrier layer is a diffusion barrier layer.

The present invention may be best understood through the following description with reference to the accompanying drawings, in which:

DETAILED DESCRIPTION OF THE PREFERRED EMBODIMENT

A process for manufacturing a device having a TiW diffusion barrier layer and a silicide layer contacted shallow junction simultaneously formed according to the present invention comprises steps of: (a) preparing a patterned Si substrate, (b) co-depositing a layer including therein Co and Ti (or Pt and Ti) on the Si substrate; (c) depositing a W layer on the Co-Ti (or Pt-Ti) layer to obtain a device having thereon a W/Co-Ti/Si (or W/Pt-Ti/Si) structure, and (d) subjecting the device to an annealing process for obtaining the device having thereon a $TiW/CoSi_2/Si$ (or TiW/PtSi/Si) structure transformed from the W/Co-Ti/Si (or W/Pt-Ti/Si) structure. In the annealing process, the TiW barrier layer and the $CoSi_2$ (or PtSi) layer are simultaneously formed. The depositing steps are executed by a sputtering process or a dual electron-beam gun evaporation.

The present invention will now be described more specifically with reference to the following preferred embodiments which, however, are presented herein for purpose of illustration and description only; it is not intended to be exhaustive or to be limited to the precise form disclosed.

The following example is illustrated by using a device having thereon a W layer of about 400Å and a layer of Co-Ti of about 360Å with an atomic composition of Co:Ti at a ratio of 63:37.

Figure 1A:
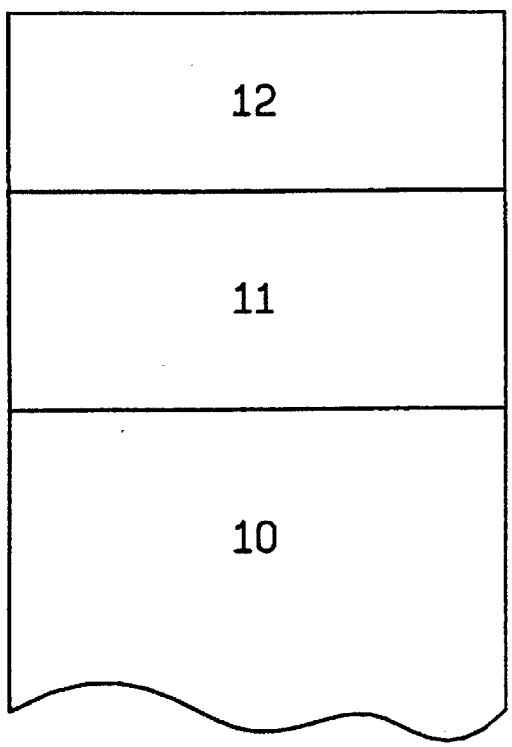
FIG. 1A is a schematic diagram showing a W/Co-Ti/Si structure before being subjected to annealing process according to the present invention.
Figure 1B:
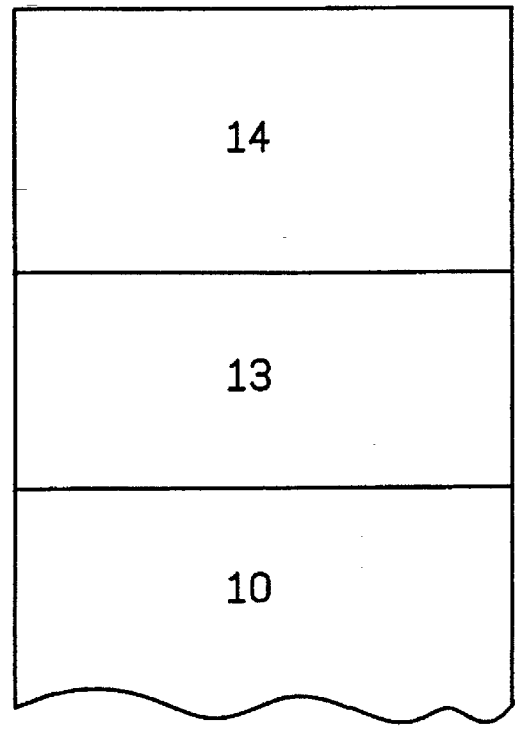
FIG. 1B is a schematic diagram of a $TiW/CoSi_2/Si$ structure transformed from the W/Co-Ti/Si structure after the annealing process according to the present invention.

The process according to one preferred embodiment of the present invention comprises steps of: (a) preparing a Si substrate 10, (b) co-depositing a Co-Ti layer 11 having therewith an appropriate composition and an appropriate thickness on the Si substrate 10 by sputtering or by dual electron beam-gun evaporation, (c) depositing a W layer 12 on the Co-Ti layer 11 to thus obtain a W/Co-Ti/Si structure, as shown in FIG. 1A, and (d) annealing the whole structure at an appropriate temperature ranging from about 620° C.–720° C. in an ordinary flowing nitrogen furnace to allow all Co atoms in the Co-Ti layer 11 to react with Si atoms in the Si substrate 10 and thereby form a $CoSi_2$ layer 13 in contact with the Si substrate 10, and all Ti atoms in Co-Ti layer 11 are incorporated into the W layer 12 to thereby form a TiW diffusion barrier layer 14 disposed on the CoSi$_2$ layer 13 and thus obtain a TiW/CoSi$_2$/Si structure, as shown in FIG. 1B. Accordingly, the TiW diffusion barrier layer 14 and the CoSi$_2$ contacted layer 13 are simultaneously formed.

Figure 2A:
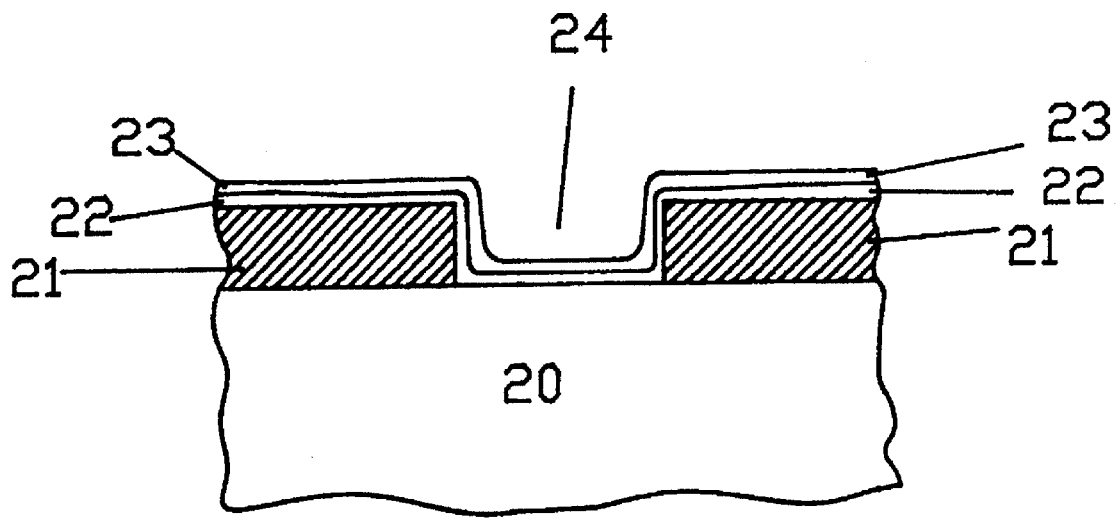
FIG. 2A is a schematic diagram of a device having a Si substrate and a W/Co-Ti deposited thereon in an acting zone according to the present invention.
Figure 2B:
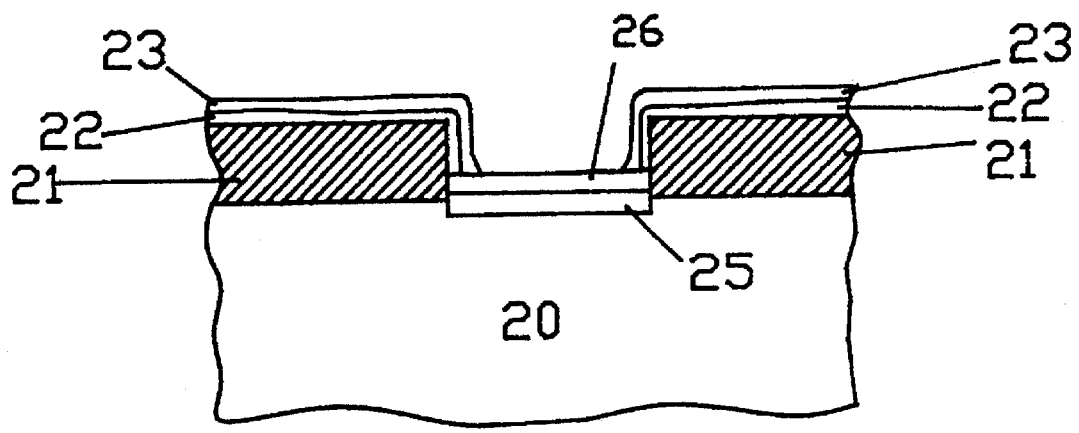
FIG. 2B is a schematic diagram of a device having a Si substrate and a transformed $TiW/CoSi_2/Si$ structure disposed thereon in an acting zone according to FIG. 1B of the present invention.
Figure 3:
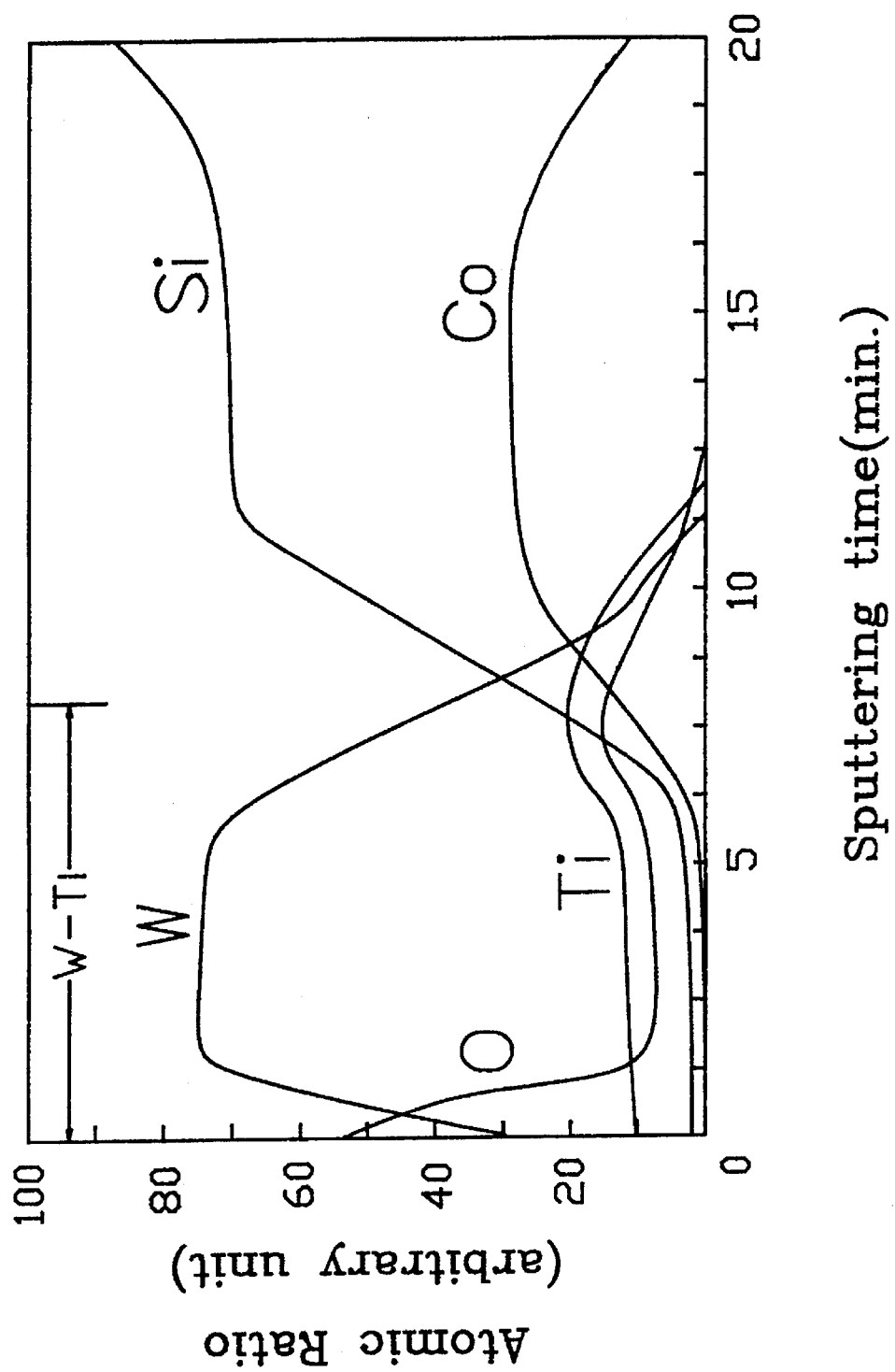
FIG. 3 is a composition depth profile of the $TiW/CoSi_2/Si$ structure shown in FIG. 1B (or the acting zone in FIG. 2B) obtained from an Auger Electron Spectroscopy (AES), according to the present invention.

Two schematic diagrams, as shown in FIGS. 2A and 2B, show a device according to one embodiment of this invention before and after subjected to the annealing process, respectively. In FIG. 2A it shows the structure of a Si substrate 20 and the W layer 23 disposed thereon, a Co-Ti layer 22, a SiO$_2$ layer 21, and an acting zone 24 having therein a W/Co-Ti structure including a W layer 23 and a Co-Ti layer 22 disposed on the Si substrate 20. The structure of W/Co-Ti in the acting zone 24, after subjected to the annealing process in a nitrogen furnace, will be simultaneously transformed into a CoSi$_2$ layer 25 and a TiW layer 26, as shown in FIG. 2B. FIG. 3 shows a composition depth profile of the TiW/CoSi$_2$/Si structure in the acting zone obtained from an Auger Electron Spectroscopy.

It is concluded according to this invention that, since the W layer extracts the Ti atoms from the Co-Ti layer 22, the W layer 23 plays a very important role in the following three aspects: (1) it is a medium for forming a TiW protective film for preventing cobalt from oxidation during the silicidation of cobalt; (2) it is beneficial to preserve the shallow junction by preventing the Ti atoms from being silicidized; and (3) it is a medium for forming a diffusion barrier layer.

Due to the fact that the silicidation temperature of Co is lower than that of Ti, during the period of forming the silicide within an appropriate temperate range, Co will be extracted from the Co-Ti layer 22 to react with Si and form thereby CoSi$_2$. On the other hand, Ti has a high solubility in W, a high reactivity to W, and a smaller atomic size with respect to Co. Therefore, after being extracted from the Co-Ti layer 22, Ti moves toward the W layer 23 and incorporates in the W layer 23. The Ti atoms reside in the W layer 23 and thereby inhibit the incorporation of Co in the W layer 23, and thus all Co atoms will react with Si to form CoSi$_2$ in contact with the Si substrate.

It should be noted that, for the sake of the complete incorporation of Ti into the W layer 23, the amount of Ti in Co-Ti layer 22 must be less than the amount of saturation limit of Ti dissoluble in the W layer 23. As a diffusion barrier layer, the composition ratio of Ti to W in the TiW layer 26 is preferably about 10:90 by weight. Furthermore, the excessive Ti over the saturation amount will form an oxide and/or a silicide of Ti between the CoSi$_2$ layer 25 and the TiW layer 26. In addition, if the annealing temperature is too high, e.g. higher than the silicidation temperatures of both Co and Ti, no matter what the amounts of Ti and W are, both of Co and Ti will react with Si to form their respective silicides. Therefore, in order to obtain a perfect transformation from the W/Co-Ti/Si structure into the TiW/CoSi$_2$/Si structure and prevent the formation of the titanium silicide, the thickness of the deposited W layer 23 and the composition ratio and the thickness of the deposited Co-Ti layer 22 should be carefully controlled.

Of course, if Pt is adopted instead of Co and similar process and the conditions mentioned above are followed, a TiW/PtSi/Si structure can be formed by transformation from a W/Pt-Ti/Si structure, and a second device having a barrier layer, i.e. a TiW layer, and a PtSi layer contacted shallow junction simultaneously formed therein is thereby obtained. Furthermore, another alternatives such as Pd and Ni can also be possibly adopted in substitution for Co for producing such a device.

The advantages, the characteristics, and the effects of the device having a diffusion barrier layer and a silicide layer contacted shallow junction simultaneously formed therein according to this invention are further described as follows.

First, the TiW layer obtained from the reaction of Ti and W is very stable and is capable of preventing Co from oxidation in the silicidation process at a temperature higher than the silicidation temperature of Co, so that Co will surely and completely react with Si to form the CoSi$_2$ layer. Therefore, the whole process can be performed in an ordinary nitrogen furnace and no additional expensive equipment is required. It is much more economical and feasible to adopt the fabrication process of the present invention than the prior ones.

Second, only Co in the Co-Ti layer 22 will form a CoSi$_2$ layer, but Ti will not. Therefore, a CoSi$_2$ contacted shallow junction is thereby possibly preserved. It is estimated that 1Å thickness of Co film will consume Si of about 3.64Å thickness to form CoSi$_2$ of about 3.52Å thickness. The density of Co is about 8.7 g/cm$^3$, that of Ti is about 4.5 g/cm$^3$, and that of W is about 19.3 g/cm$^3$. According to these data, it can be calculated that, if a first starting structure is W(400Å)/Co$_{63}$Ti$_{37}$(360Å)/Si, a first final structure of TiW/CoSi$_2$(658Å)/Si is obtained after the annealing process where a silicidizing reaction of Co occurs. The composition of the TiW layer has a ratio of Ti:W being 9.1:90.9 by weight which is very close to a composition ratio, i.e. Ti:W=10:90 by weight, of an ideal TiW diffusion barrier layer. The consumed Si is about 680Å thickness in the silicidizing reaction. In comparison with a second starting structure of W/Co(360Å)/Si instead of W/Co-Ti/Si, after the annealing process a second final structure of W/CoSi$_2$/Si is obtained, and the consumed Si is about 1310Å thickness. The results of both the first and the second final structures show that the consumption of Si in the first structure is about 630Å less than the second structure. The extent of the formed CoSi$_2$ embedded in the Si substrate is smaller in the first structure as well. Therefore, the present invention is advantageous to the fabrication of a silicide contact to a shallow junction.

Figure 4:
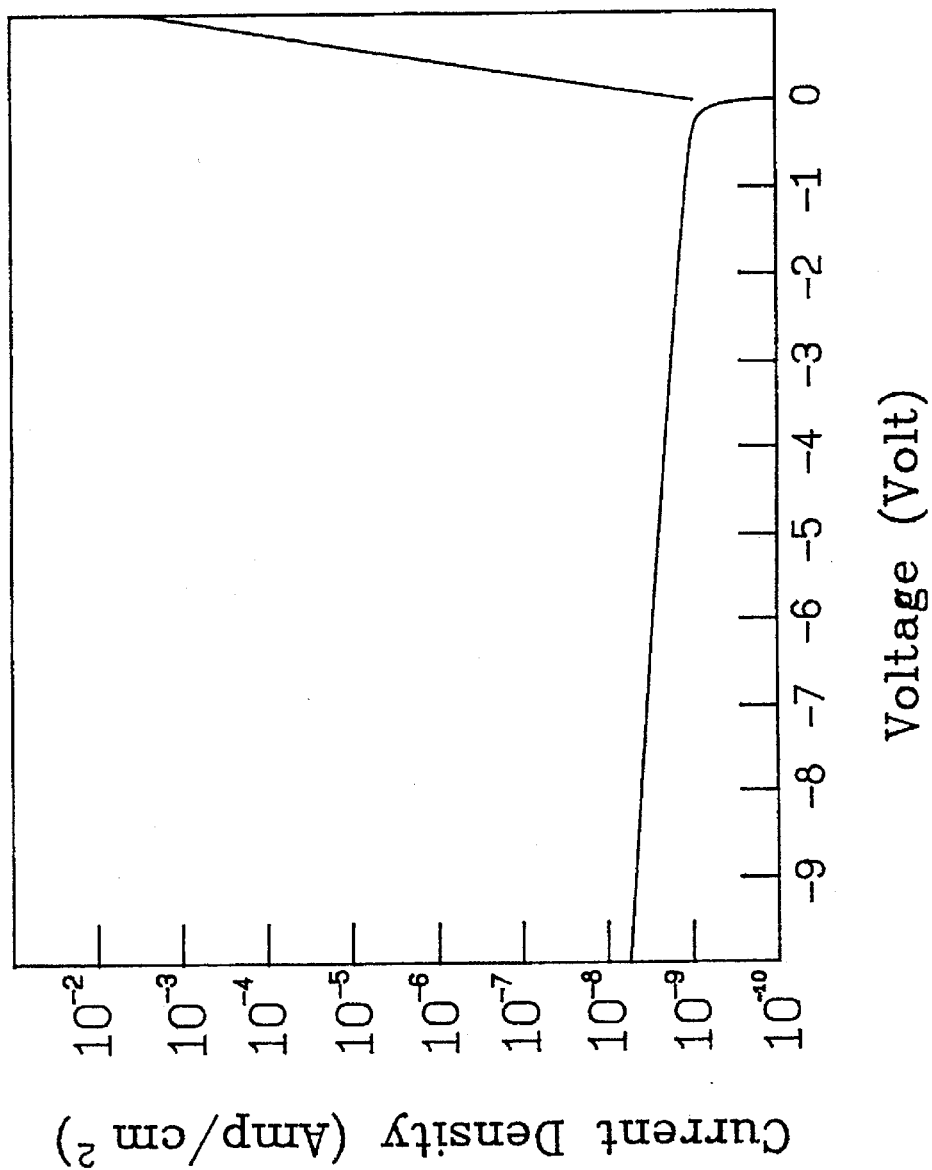
FIG. 4 is an I-V plot showing a characteristic curve of an $Al/TiW/CoSi_2/p^+n$ diode according to the present invention.

Third, FIG. 4 shows an I-V characteristic for an Al/TiW/CoSi$_2$/p$^+$n diode. This diode is manufactured by firstly depositing W(400Å)/Co$_{63}$Ti$_{37}$(360Å) layers on a p+n junction having a junction depth of about 0.26 μm, secondly annealing and silicidizing the W/Co-Ti/p$^+$n structure into a TiW/CoSi$_2$/p$^+$n structure, and thirdly depositing an Al layer to the TiW/CoSi$_2$/p$^+$n structure to obtain the Al/TiW/CoSi$_2$/p$^+$n diode. When the Al layer is deposited onto the TiW layer, the TiW layer can act as a diffusion barrier layer to isolate the Al layer and the CoSi$_2$ layer. It is proved from experiments that the TiW layer resulting from the 400Å of W layer incorporated therein Ti wherein the weight ratio of Ti:W is about 10:90 can effectively hinder the reaction between Al and CoSi$_2$ up to a temperature of 550° C. without degrading the I-V characteristic. As shown in FIG. 4, the density of leakage current is only about 2–3 nA/cm$^2$ when a reverse bias of 5V is applied to the diode, and ideal factor n is about 1.04.

Figure 5:
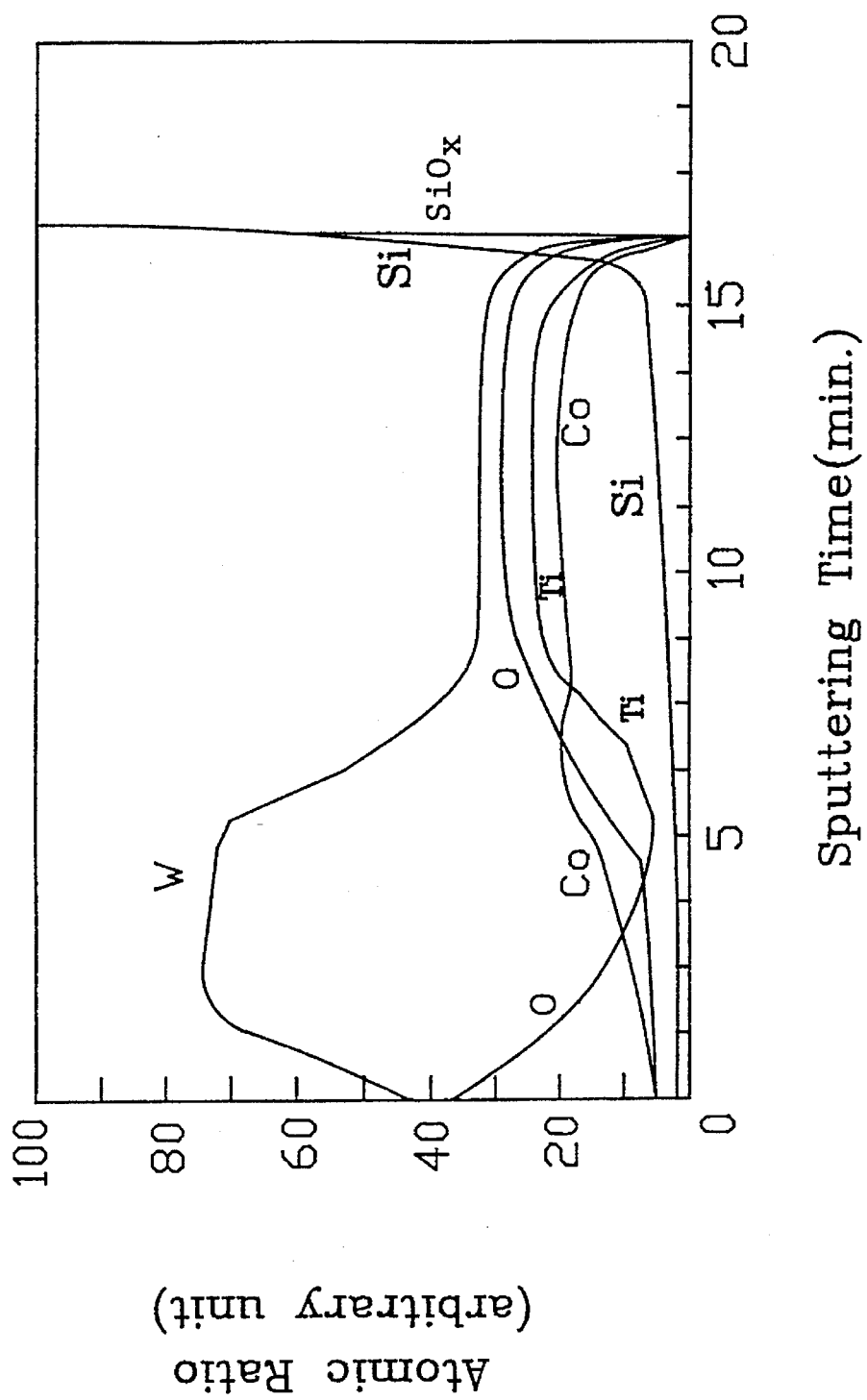
FIG. 5 is a composition depth profile of the W(400Å)/$Co_{63}Ti_{37}$(360Å) structure deposited on the $SiO_2$ layer outside the acting zone and obtained from an Auger Electron Spectroscopy, according to the present invention.

Fourth, FIG. 5 shows a composition depth profile of the W(400Å)/Co$_{63}$Ti$_{37}$(360Å) structure deposited on the SiO$_2$ layer outside the acting zone 24, as shown in FIG. 2A, and having been subjected to annealing process at about 760° C. for about 30 minutes. Because the process according to the present invention is to conduct the silicidation treatment in a nitrogen furnace, the Co-Ti layer 22 deposited on the SiO$_2$ layer 21 is invaded by the residual oxygen, as shown in FIG.

5, and therefore the lateral growth of the silicide of Co is hindered.

Fifth, because of Ti in the W/Co-Ti/Si structure is in direct contact with the Si substrate 20, native oxide originally resided on the Si substrate 20 is easily destroyed by Ti. Therefore, $CoSi_2$ epitaxial layer is easily grown on the Si substrate 20. The resistivity of an epitaxial layer is low and is beneficial to lower the resistivity of the acting zone.

It is concluded that, according to the present invention, only adopting one annealing process and executing it in an ordinary nitrogen furnace rather than any other expensive equipment, a final product of the device having a TiW diffusion barrier layer and a silicide layer contacted shallow junction simultaneously formed therein is obtained. The process is quite simple in comparison with the prior ones. In addition, only Co will react with Si to form a $CoSi_2$ contact layer so that a silicide layer contacted shallow junction is assured. Furthermore, the lateral growth of $CoSi_2$ is effectively hindered and the resistivity of the acting zone is effectively lowered.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A process for fabricating a device having a TiW barrier layer and a relatively shallow junction contacted with a silicide layer wherein said TiW barrier layer and said silicide layer are simultaneously formed, comprising steps of:

(a) preparing a Si substrate;

(b) applying a layer including therein Ti and an element X on said Si substrate, wherein said element X is selected from the group consisting of Co, Pt, Pd, and Ni;

(c) applying a W layer on the layer including therein said Ti and said element X for forming a W/X-Ti/Si structure; and (d) transforming said W/X-Ti/Si structure into a TiW/silicide/Si structure to obtain said device having said TiW barrier layer and said silicide layer contacted shallow junction.

2. A process as claimed in claim 1, wherein said step (b) is executed by a deposition process.

3. A process as claimed in claim 2, wherein said step (b) is executed by one of a sputtering process and a dual electron-beam gun evaporation.

4. A process as claimed in claim 1, wherein said step (c) is executed by a deposition process.

5. A process as claimed in claim 1, wherein said applied W layer has a proper thickness and said applied X-Ti layer has a thickness and composition such that after said step (d) is executed, said X element will completely react with Si element of said substrate to form said silicide layer and said Ti in said X-Ti layer will be completely dissolved in said W layer.

6. A process as claimed in claim 5, wherein said thickness of said applied W layer is about 400Å.

7. A process as claimed in claim 5, wherein said thickness of said X-Ti layer is about 360Å.

8. A process as claimed in claim 5, wherein said composition of said X-Ti layer has an X-Ti atomic ratio of about 63:37.

9. A process as claimed in claim 5, wherein a Ti-W weight ratio of said TiW layer is about 10:90.

10. A process as claimed in claim 1, wherein said step (d) is a heat-treating process.

11. A process as claimed in claim 10, wherein said step (d) is annealing process.

12. A process as claimed in claim 11, wherein said step (d) is executed at a relatively high temperature ranging from about 620° C. to about 760° C.

13. A process as claimed in claim 11, wherein said step (d) is executed for about 30 minutes.

14. A process as claimed in claim 11, wherein said step (d) is executed in the presence of nitrogen.

15. A process as claimed in claim 11, wherein said step (d) is executed once.

16. A process as claimed in claim 1, wherein said barrier layer is a diffusion barrier layer.

* * * * *